(12) United States Patent
Horikawa (10) Patent No.: US 11,729,901 B2
(45) Date of Patent: Aug. 15, 2023

(54) ELECTRONIC CIRCUIT AND CIRCUIT BOARD

(71) Applicant: FUJIFILM Business Innovation Corp., Tokyo (JP)

(72) Inventor: Daisuke Horikawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1 day.

(21) Appl. No.: 17/380,019

(22) Filed: Jul. 20, 2021

(65) Prior Publication Data

US 2022/0312581 A1 Sep. 29, 2022

(30) Foreign Application Priority Data

Mar. 24, 2021 (JP) ................. 2021-049376

(51) Int. Cl.
 *H05K 1/02* (2006.01)
 *H01P 1/20* (2006.01)
 *H05K 1/16* (2006.01)

(52) U.S. Cl.
 CPC ......... *H05K 1/0236* (2013.01); *H01P 1/2005* (2013.01); *H05K 1/16* (2013.01); *H05K 2201/09263* (2013.01)

(58) Field of Classification Search
 CPC ...... H05K 1/0236; H05K 1/2005; H05K 1/16; H05K 2201/09263; H01P 1/2005
 See application file for complete search history.

(56) References Cited

U.S. PATENT DOCUMENTS

| 9,564,870 B2 | 2/2017 | Kasahara et al. |
| 9,929,455 B2 | 3/2018 | Tanaka |

FOREIGN PATENT DOCUMENTS

| JP | 2008288770 | | 11/2008 |
| JP | 2010183545 A | * | 8/2010 |
| JP | 2014197877 | | 10/2014 |
| JP | 2015179699 | | 10/2015 |
| WO | 2014006796 | | 1/2014 |

* cited by examiner

*Primary Examiner* — Hafizur Rahman
*Assistant Examiner* — Kimberly E Glenn
(74) *Attorney, Agent, or Firm* — JCIPRNET (57) ABSTRACT

An electronic circuit includes a conductor column that is connected to a ground of a first layer which is any one of plural conductor layers stacked in a separated state and extends in a stacking direction, a first conductor line that is connected to the conductor column to extend in a band shape in a second layer different from the first layer of the plural conductor layers, and of which an end portion separated from the conductor column is an open end, and a second conductor line that extends in a band shape in any layer of the plural conductor layers, in which each of the first conductor line and the second conductor line has one neighboring portion constituting at least a pair of neighboring portions, which are close to each other to be connectable, and a first end portion of the second conductor line, which is separated from the neighboring portion formed on the second conductor line, is an open end.

20 Claims, 9 Drawing Sheets

FIG. 1

RELATED ART

ELECTRONIC CIRCUIT AND CIRCUIT BOARD

CROSS-REFERENCE TO RELATED APPLICATIONS

This application is based on and claims priority under 35 USC 119 from Japanese Patent Application No. 2021-049376 filed Mar. 24, 2021.

BACKGROUND

(i) Technical Field

The present invention relates to an electronic circuit and a circuit board.

(ii) Related Art

A technique of suppressing propagation of electromagnetic wave noise by an electromagnetic band gap (EBG) structure formed on a circuit board is known.

For example, JP2014-197877A discloses an EBG structure that employs a spiral shape to reduce a size.

WO2014/006796A discloses an EBG structure in which capacitance is imparted by forming an island-shaped conductor to widen a frequency band having a noise reduction effect.

JP2008-288770A discloses an EBG structure in which adjacent metal small plates are connected through a capacitor to suppress power consumption.

Further, JP2015-179699A proposes that a shield case is placed on a circuit board with the EBG structure and around the circuit board and a shape of the shield case is changed to change the frequency band for the noise reduction.

SUMMARY

Aspects of non-limiting embodiments of the present disclosure relate to an electronic circuit in which a noise reduction frequency band of an electronic circuit, which reduces electromagnetic wave noise, can be changed by the electronic circuit and a circuit board on which the electronic circuit is mounted.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an electronic circuit including a conductor column that is connected to a ground of a first layer which is any one of a plurality of conductor layers stacked in a separated state and extends in a stacking direction, a first conductor line that is connected to the conductor column to extend in a band shape in a second layer different from the first layer of the plurality of conductor layers, and of which an end portion separated from the conductor column is an open end, and a second conductor line that extends in a band shape in any layer of the plurality of conductor layers, in which each of the first conductor line and the second conductor line has one neighboring portion constituting at least a pair of neighboring portions, which are close to each other to be connectable, and a first end portion of the second conductor line, which is separated from the neighboring portion formed on the second conductor line, is an open end.

BRIEF DESCRIPTION OF THE DRAWINGS

Exemplary embodiment(s) of the present invention will be described in detail based on the following figures, wherein.

DETAILED DESCRIPTION

First, an electromagnetic band gap (EBG) structure will be described. The EBG structure is a periodic structure having a frequency band (Band Gap) in which propagation of an electromagnetic wave is suppressed. With forming of the EBG structure near an electronic circuit that emits electromagnetic wave noise on a circuit board, the propagation of the electromagnetic wave noise emitted from the electronic circuit is suppressed.

Figure 1:
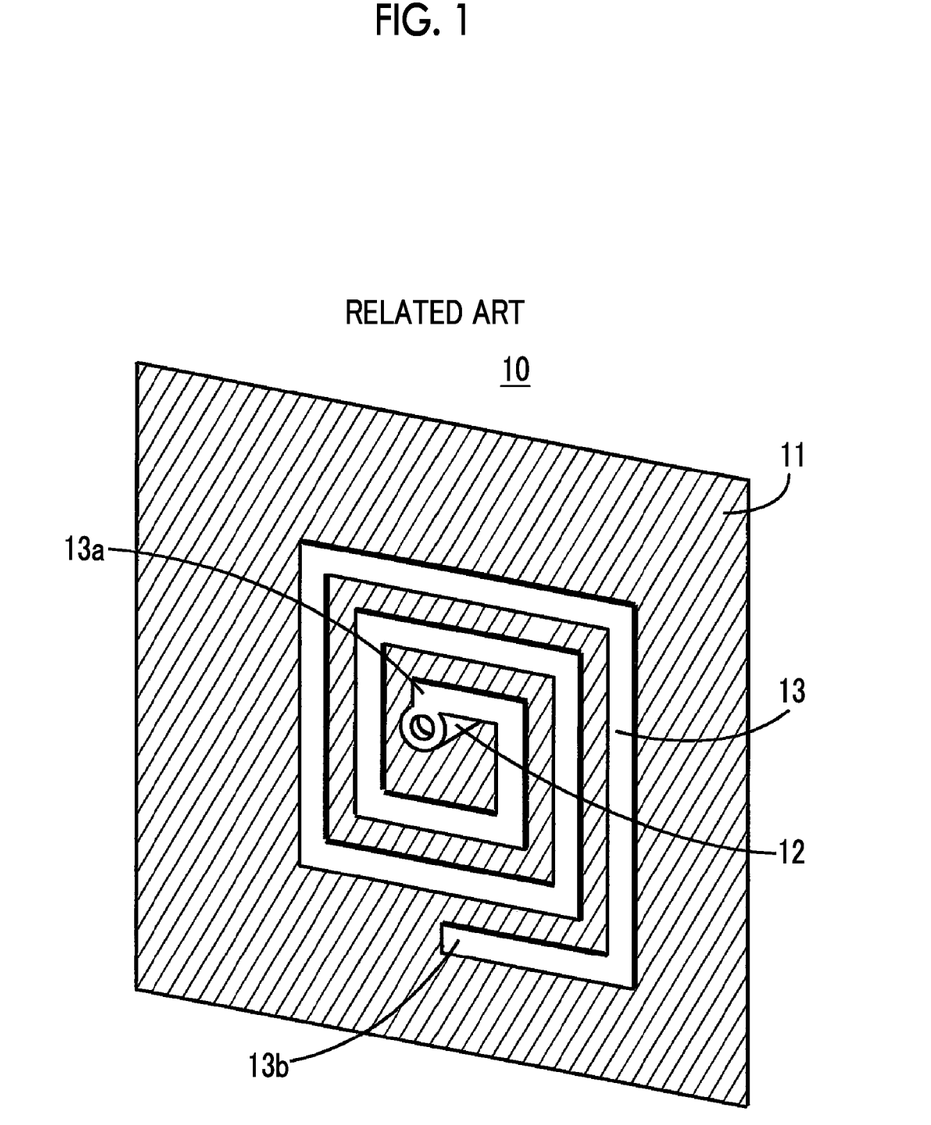
FIG. 1 is a schematic view of an example of a circuit for one unit constituting an EBG structure in the related art.

FIG. 1 is a schematic view of an example of a circuit for one unit constituting an EBG structure in the related art.

A circuit board having a plurality of conductor layers is employed, and a first layer which is anyone of the plurality of layers is a ground 11. A conductor column referred to as a via 12, which is connected to the ground 11 which is the first layer and extends in a stacking direction, is formed. A conductor line referred to as a stub 13, which extends in a spiral shape in a second layer different from the first layer is formed. One end 13a of the stub 13 is connected to the via 12. An end portion 13b of the stub 13 separated from the via 12 is an open end, that is, an open end that is not directly connected to another conductor. The EBG structure is formed by arranging a plurality of unit structures as shown in FIG. 1 on the circuit board.

The stub 13 shown in FIG. 1 is a conductor line that does not have the spiral shape composed of a curved line, but extends from one end portion connected to the via 12 toward the other end portion while intermittently bending in the same rotation direction. Specifically, the stub 13 is a conductor line extending while intermittently bending by 90° in the same rotation direction. Not only the spiral shape composed of a continuous curve but also the shape extending while intermittently bending, for example, by 45° or 90°, is referred to as the spiral shape.

Figure 2:
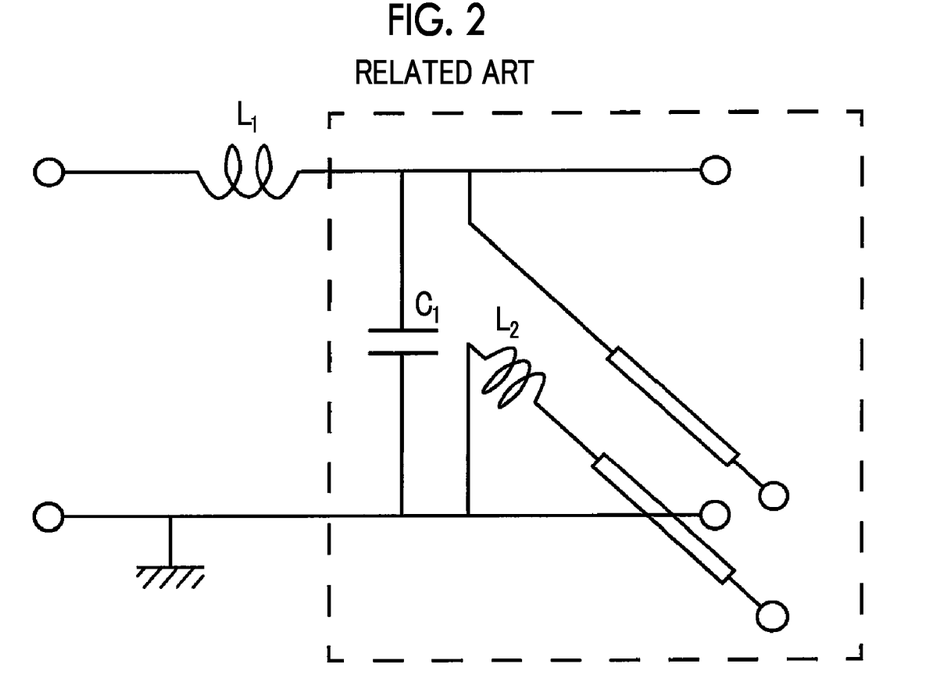
FIG. 2 is a distributed constant circuit which is an equivalent circuit of the EBG structure.

FIG. 2 is a distributed constant circuit which is an equivalent circuit of the EBG structure.

The equivalent circuit of the EBG structure is expressed as the distributed constant circuit shown in FIG. 2. An inductance L1 and a capacitance C1 are respectively inductance and capacitance of a transmission line. The inductance L1 among the above has little relationship to frequency characteristics that suppress an electromagnetic wave noise radio wave, and a portion surrounded by a broken line is related to the frequency characteristics. Admittance Y in the portion surrounded by the broken line is represented by the following equation.

$$Y = j\omega C_1 + \frac{1}{Z_{stub} + j\omega L_2} \quad (1)$$

Here,
Zstub is impedance of stub 13,
C1 is capacitance between adjacent unit structures,
L2 is inductance of via 12,
ω is angular frequency, and
j is complex symbol.

Figure 3:
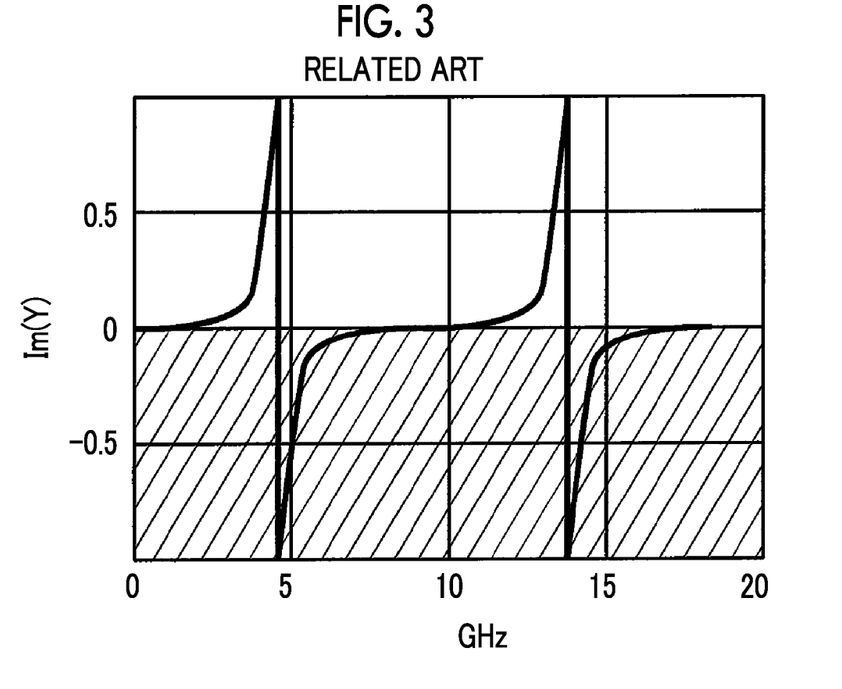
FIG. 3 is a graph showing frequency characteristics of admittance Y.

FIG. 3 is a graph showing the frequency characteristics of the admittance Y. The vertical axis of FIG. 3 is an imaginary component Im (Y) of the admittance Y, and the horizontal axis is a frequency (GHz).

A region where Im (Y) is negative, which is shown with hatching in FIG. 3, is referred to as an inductance region, and a region where Im (Y) is positive is referred to as a capacitance region. In this EBG structure, the propagation of the electromagnetic wave noise at a frequency within the inductance region, that is, the frequency region where Im (Y) is negative is suppressed. The frequency region in which Im (Y) is negative is related to a length of the stub 13. A pattern of the frequency characteristics shifts to a low frequency side as the length of the stub 13 is longer, and the pattern of the frequency characteristics shifts to a high frequency side as the length of the stub 13 is shorter.

Figure 4A:
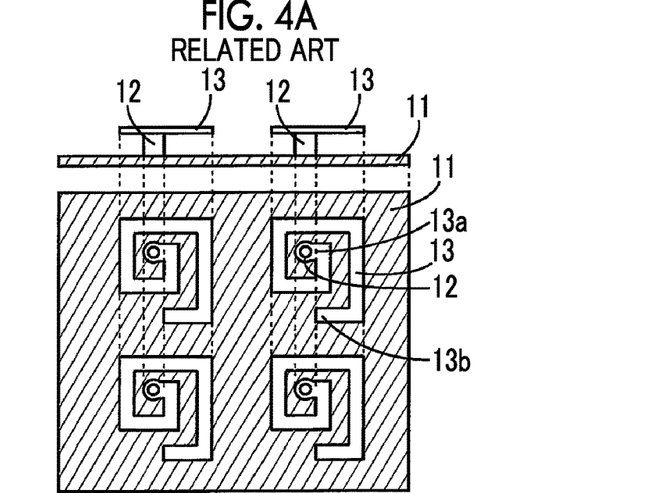
FIGS. 4A to 4C are schematic views of EBG structures of various shapes.
Figure 4B:
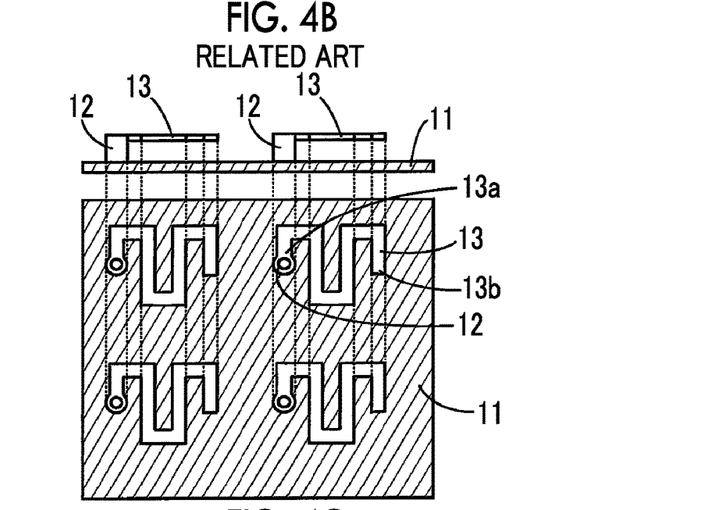
Figure 4C:
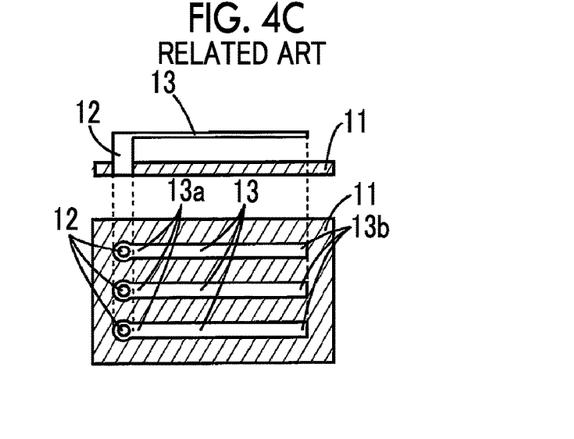

FIGS. 4A to 4C are schematic views of EBG structures of various shapes.

FIG. 4A shows an EBG structure in which a plurality of units having spiral-shaped stubs 13 described above are arranged. Similar to FIG. 1, the stub 13 shown here is a conductor line that extends from the one end portion connected to the via 12 toward the other end portion while intermittently bending by 90° in the same rotation direction. The EBG structure is formed by any spiral shape having the spiral shape in the above definition.

FIG. 4B shows an EBG structure in which a plurality of units having so-called meander-shaped stubs 13 extending while reciprocating left and right are arranged. FIG. 4B shows a meander shape whose extending direction is reversed by bending twice by 90° in the same rotation direction, but the shape of the stub 13 is not limited thereto. For example, the shape thereof may be a shape whose extending direction is reversed while drawing a curve or a shape whose extending direction is reversed by bending four times by 45°. One end 13a of the stub 13 of each unit is connected to the via 12 of each unit. Each stub 13 extends in the meander shape, and the end portion 13b on a side separated from the via 12 is the open end.

FIG. 4C shows an EBG structure in which a plurality of units having stubs 13 extending linearly are arranged. One end 13a of the stub 13 of each unit is connected to the via 12 of each unit. Each stub 13 extends in a linear shape, and the end portion 13b on the side separated from the via 12 is the open end.

As illustrated in FIGS. 4A to 4C, the stubs 13 having various shapes can be employed for the EBG structure. However, the length of the stub 13 from a location connected to the via 12 to the open end is related to a frequency of noise that suppresses the propagation, and a long stub is required to suppress low-frequency noise. Therefore, in order to suppress the low-frequency noise, forming of the stub 13 which has the spiral shape and is connected to the via 12 at the one end 13a thereof is favorable in terms of miniaturization.

Based on the above description of the EBG structure, exemplary embodiments of the present invention will be described below.

Figure 5:
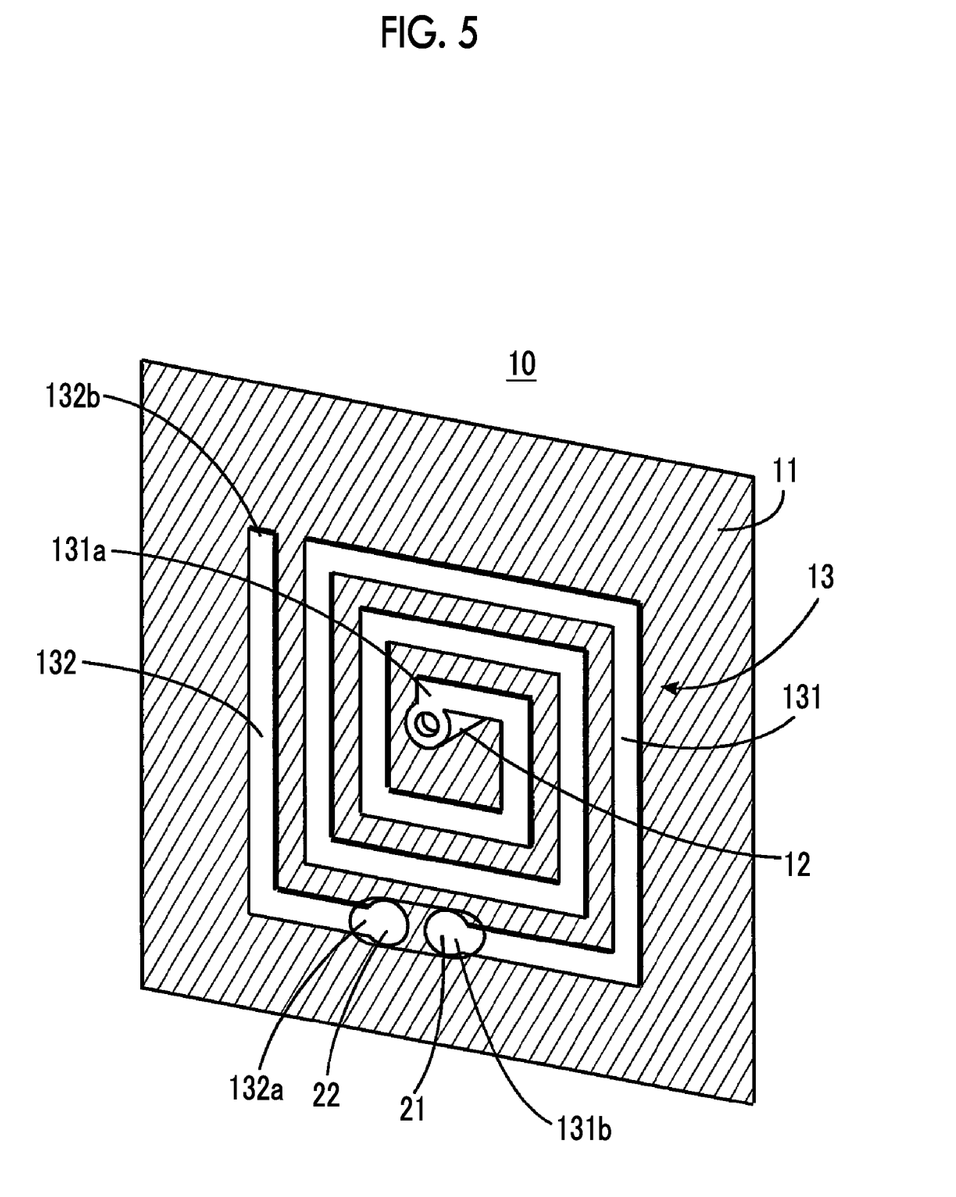
FIG. 5 is a view of a circuit for one unit of an EBG structure constituting an electronic circuit as a first exemplary embodiment of the present invention.

FIG. 5 is a view of a circuit for one unit of the EBG structure constituting the electronic circuit as a first exemplary embodiment of the present invention. In the present exemplary embodiment, a plurality of the units shown in FIG. 5 are arranged on the circuit board to form the EBG structure.

As in the example in the related art shown in FIG. 1, a circuit board 10 having a plurality of conductor layers is employed, and a first layer which is any one of the plurality of layers is the ground 11. A conductor column referred to as a via 12, which is connected to the ground 11 which is the first layer and extends in a stacking direction, is formed. A conductor line referred to as a stub 13, which extends in a spiral shape in a second layer different from the first layer is formed. In the present exemplary embodiment, a surface layer formed on a surface of the circuit board 10 is employed as the second layer. In the present exemplary embodiment, a spiral shape extending while changing the direction by 90° is employed as the conductor line. However, the conductor line is not limited to the spiral shape extending while changing the direction by 90°. As defined above, the conductor line extending from the one end portion toward the other end portion while continuously or intermittently bending in the same rotation direction may be employed.

The stub 13 is composed of a first conductor line 131 and a second conductor line 132.

One end portion 131a of the first conductor line 131 is connected to the via 12 and extends toward the other end in the spiral shape. An end portion 131b of the first conductor line 131 on a side separated from the via 12 is an open end, that is, an open end that is not directly connected to another conductor. A pad 21 for connecting to the second conductor line is formed at the end portion 131b.

The second conductor line 132 has one end portion 132a at a position close to the end portion 131b of the first conductor line 131 on the side separated from the via 12 and extends in a shape inheriting the spiral shape of the first conductor line 131. That is, a shape that combines the first conductor line 131 and the second conductor line 132 is also a spiral shape in which the spiral shape of the first conductor line 131 is extended. The second conductor line 132 has open ends at both end portions 132a and 132b. Further, a pad 22 for connecting to the first conductor line 131 is formed at the end portion 132a of the second conductor line 132 on a side close to the end portion 131b of the first conductor line 131.

A protective film (not shown) referred to as a resist is formed on the surface of the circuit board 10, but no protective film is formed around the pads 21 and 22. In FIG. 5, a region where the protective film is not formed is indicated by an oval. Accordingly, the pads 21 and 22 can be connected as needed even after the circuit board 10 is manufactured. The pads 21 and 22 correspond to an example of a pair of neighboring portions according to the exemplary embodiment of the present invention.

The noise reduction frequency at which the propagation is suppressed in the EBG structure is generally represented by the following equation.

$$\text{Noise reduction frequency} = \text{speed of light}/(4 \times \text{length of stub}) \quad (2)$$

That is, the noise reduction frequency depends on the length of the stub.

In the present exemplary embodiment, only the first conductor line 131 acts as the stub in a case where the pads 21 and 22 are not connected, and the conductor line formed by combining the first conductor line 131 and the second conductor line 132 acts as the stub in a case where the pads 21 and 22 are connected. That is, according to the present exemplary embodiment, the frequency of noise that suppresses the propagation can be changed after the circuit board 10 is manufactured.

This is effective, for example, in a case where the frequency of noise emitted from a circuit, which is a noise source, incorporated on the circuit board 10 is determined at a time of the incorporation of the circuit board 10 into a device (not shown), different depending on usage of the circuit, or changed due to aging after use.

The pads 21 and 22 may be connected by, for example, a jumper wire or a passive component for short circuit. Alternatively, the connection is not limited thereto, and a passive component including inductance, capacitance, or the like may be used for connection.

Figure 6:
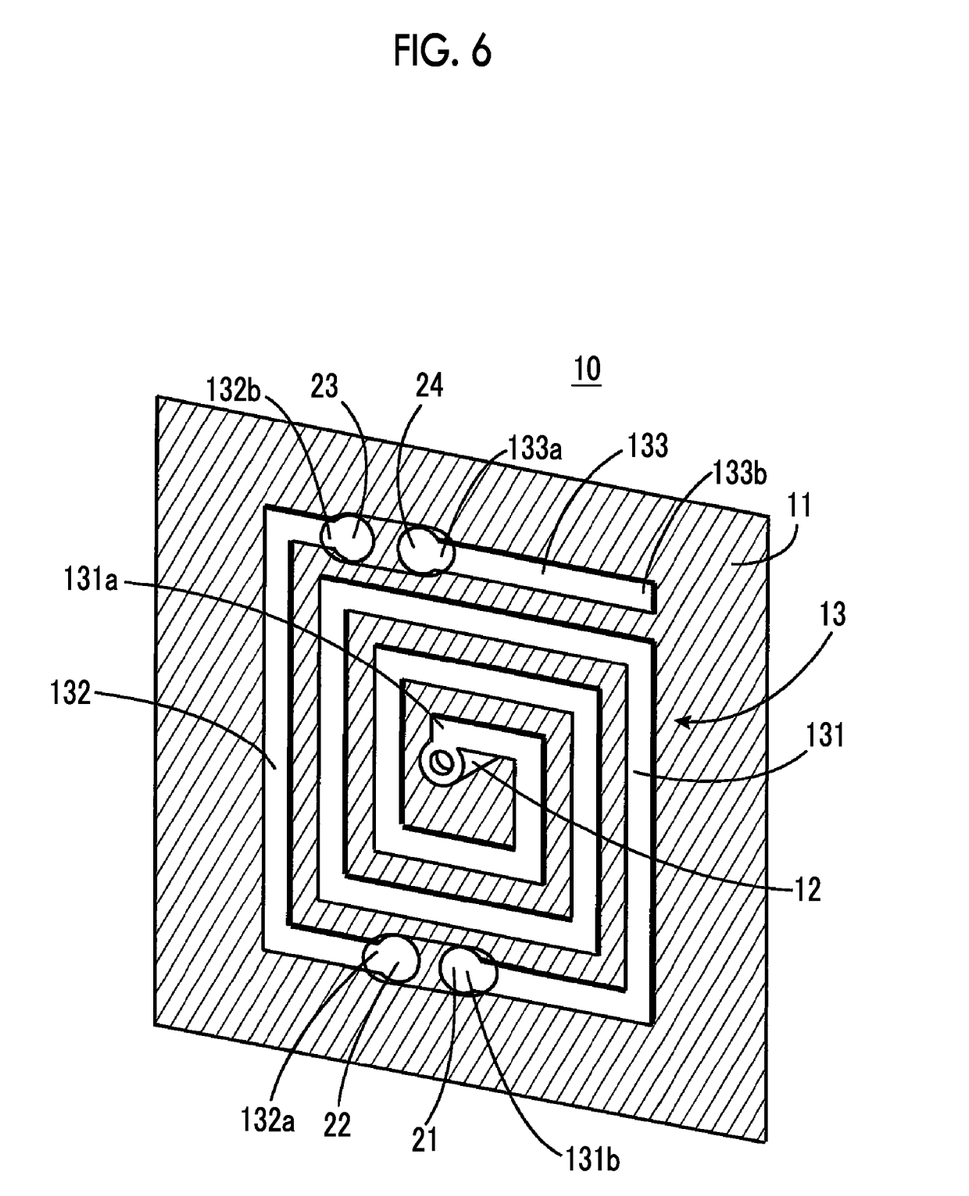
FIG. 6 is a view of a circuit for one unit of an EBG structure constituting an electronic circuit as a second exemplary embodiment of the present invention.

FIG. 6 is a view of a circuit for one unit of an EBG structure constituting an electronic circuit as a second exemplary embodiment of the present invention. In the present exemplary embodiment, a plurality of the units shown in FIG. 6 are arranged on the circuit board to form the EBG structure.

The stub 13 shown in FIG. 6 is composed of the first conductor line 131, the second conductor line 132, and further a third conductor line 133.

One end portion 131a of the first conductor line 131 is connected to the via 12 and extends toward the other end in the spiral shape. An end portion 131b of the first conductor line 131 on a side separated from the via 12 is an open end, that is, an open end that is not directly connected to another conductor. A pad 21 for connecting to the second conductor line is formed at the end portion 131b.

The second conductor line 132 has one end portion 132a at a position close to the end portion 131b of the first conductor line 131 on the side separated from the via 12 and extends in a shape inheriting the spiral shape of the first conductor line 131. That is, a shape that combines the first conductor line 131 and the second conductor line 132 is also a spiral shape in which the spiral shape of the first conductor line 131 is extended. The second conductor line 132 has open ends at both end portions 132a and 132b. The pad 22 for connecting to the first conductor line 131 is formed at the end portion 132a of the second conductor line 132 on a side close to the end portion 131b of the first conductor line 131. Further, a pad 23 for connecting to the third conductor line 133 is also formed at the other end portion 132b of the second conductor line 132.

The third conductor line 133 has one end portion 133a at a position close to the end portion 132b of the second conductor line 132 on a side separated from the pad 21 of the first conductor line 131 and extends in a shape inheriting the spiral shapes of the first conductor line 131 and the second conductor line 132. That is, a shape that combines the first conductor line 131, the second conductor line 132, and further the third conductor line 133 is also a spiral shape in which the spiral shape consisting of the first conductor line 131 and the second conductor line 132 is extended. Similar to the second conductor line 132, the third conductor line 133 also has open ends at both end portions 133a and 133b. A pad 24 for connecting to the second conductor line 132 is formed at the end portion 133a of the third conductor line 133 on a side close to the end portion 132b of the second conductor line 132.

A protective film (not shown) referred to as a resist is formed on the surface of the circuit board 10, but no protective film is formed around the pads 21 and 22 and around the pads 23 and 24. In FIG. 6, a region where the protective film is not formed is indicated by an oval. Accordingly, the pads 21 and 22 and the pads 23 and 24 can be connected as needed even after the circuit board 10 is manufactured.

In the present exemplary embodiment, only the first conductor line 131 acts as the stub 13 in a case where the pads 21 and 22 are not connected, and the conductor line formed by combining the first conductor line 131 and the second conductor line 132 acts as the stub 13 in a case where the pads 21 and 22 are connected. Further, in a case where the pads 23 and 24 are connected in addition to the connection between the pads 21 and 22, the conductor line formed by combining the first conductor line 131, the second conductor line 132, and further the third conductor line 133 acts as the stub 13. That is, according to the present exemplary embodiment, the frequency of noise that suppresses the propagation can be changed in two stages after the circuit board 10 is manufactured.

Figure 7:
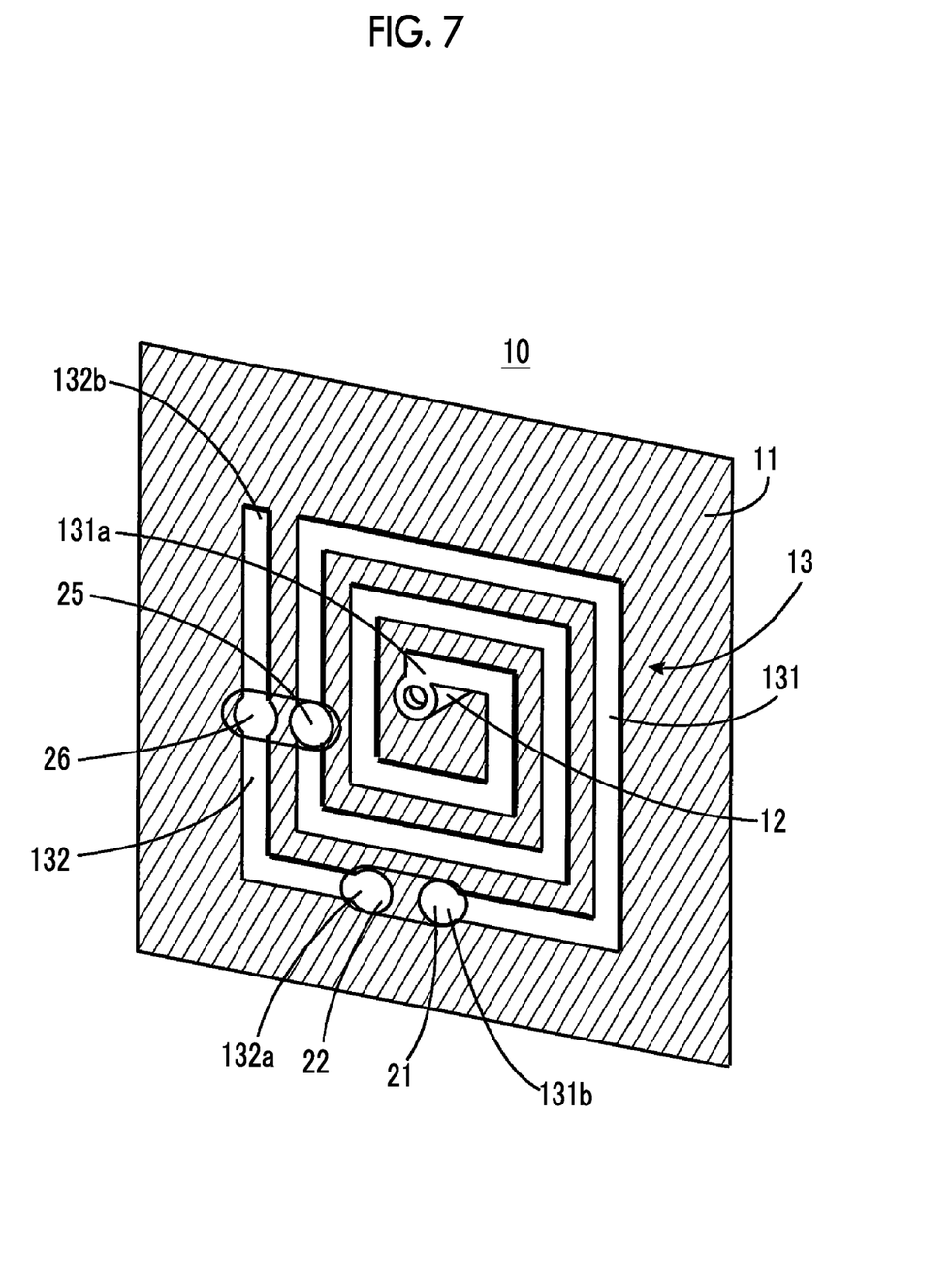
FIG. 7 is a view of a circuit for one unit of an EBG structure constituting an electronic circuit as a third exemplary embodiment of the present invention.

FIG. 7 is a view of a circuit for one unit of an EBG structure constituting an electronic circuit as a third exemplary embodiment of the present invention. In the present exemplary embodiment, a plurality of the units shown in FIG. 7 are arranged on the circuit board to form the EBG structure.

The circuit shown in FIG. 7 is a circuit in which a part is added to the circuit shown in FIG. 5, and duplicate description of the contents described with reference to FIG. 5 is omitted here.

In the case of the circuit shown in FIG. 7, pads 25 and 26 are formed at positions adjacent to each other on the first conductor line 131 and the second conductor line 132, in addition to the same configuration as the circuit shown in FIG. 5. A protective film is not formed around the pads 25 and 26.

In the case of the example shown in FIG. 7, in a case where neither the pads 21 and 22 nor the pads 25 and 26 are connected, only the first conductor line 131 acts as the stub 13. In a case where the pads 21 and 22 are connected, the stub 13 having a length that combines the first conductor line 131 and the second conductor line 132 is formed. In a case where the pads 25 and 26 are connected, a conductor line from the via 12 to the end portion 132b of the second conductor line 132, which is shorter than the total length of the first conductor line 131, appears. Accordingly, an act of noise reduction on a high frequency side can be added by lowering the noise reduction frequency to the low frequency side with the connection of the pads 21 and 22 or by connecting the pads 25 and 26, as compared with the case where only the first conductor line 131 acts as the stub 13.

Figure 8:
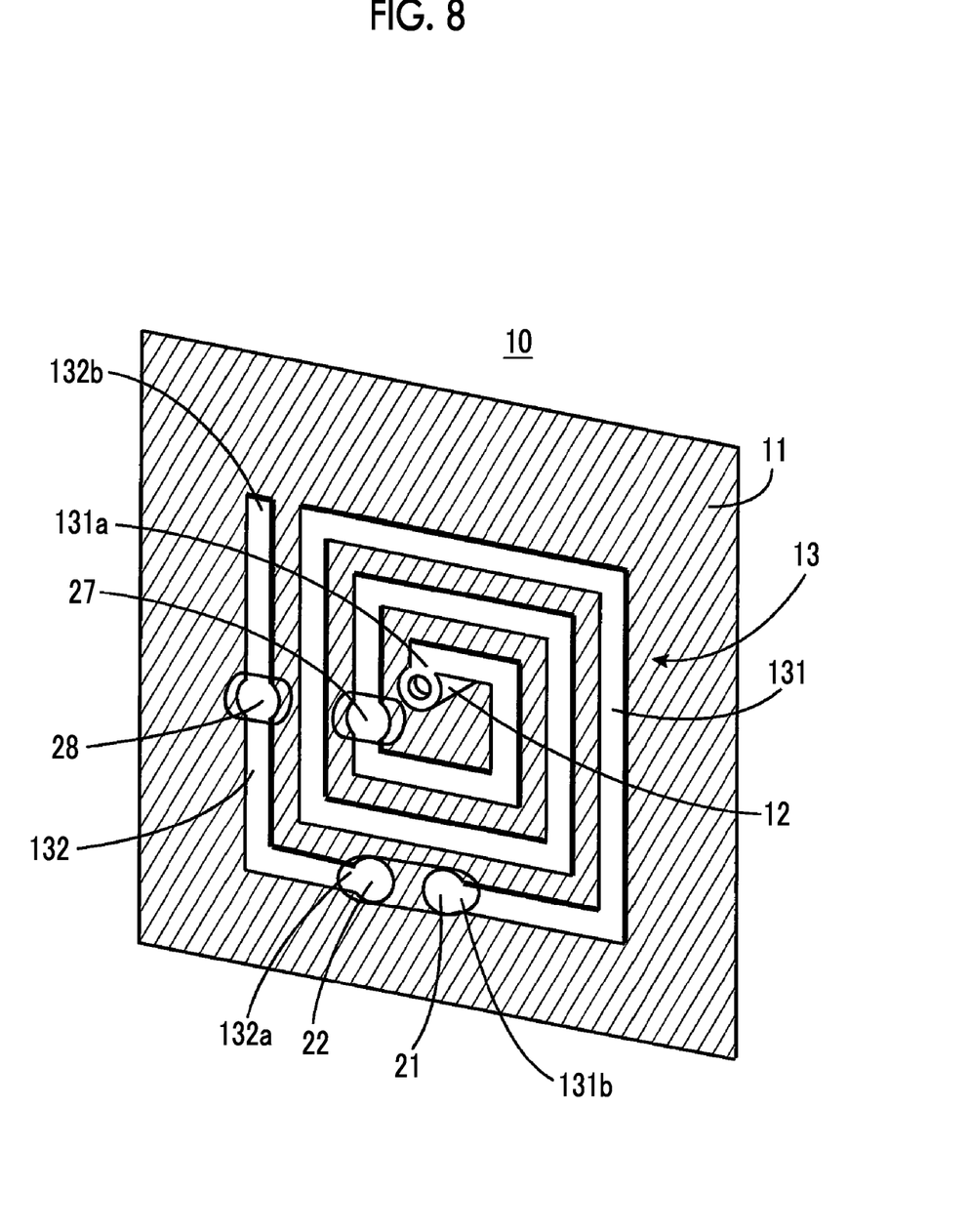
FIG. 8 is a view of a circuit for one unit of an EBG structure constituting an electronic circuit as a fourth exemplary embodiment of the present invention.

FIG. 8 is a view of a circuit for one unit of an EBG structure constituting an electronic circuit as a fourth exemplary embodiment of the present invention. In the present exemplary embodiment, a plurality of units shown in FIG. 8 are arranged on the circuit board to form the EBG structure.

In the description of FIG. 8, only differences from FIG. 7 will be described.

In the case of the circuit shown in FIG. 7, the pads 25 and 26 are formed at the positions adjacent to each other on the first conductor line 131 and the second conductor line 132. In the case of FIG. 8, pads 27 and 28 are formed at positions adjacent to each other with one interposed first conductor line 131 between the pads are formed. A protective film is not formed around the pad 27 and around the pad 28.

In the case of the example shown in FIG. 8, in a case where the pads 27 and 28 are connected, a stub shorter than in the case where the pads 25 and 26 are connected in FIG. 7 appears. Therefore, the act of noise reduction on the high frequency side can be added more than in the case where the pads 25 and 26 are connected in FIG. 7.

Figure 9:
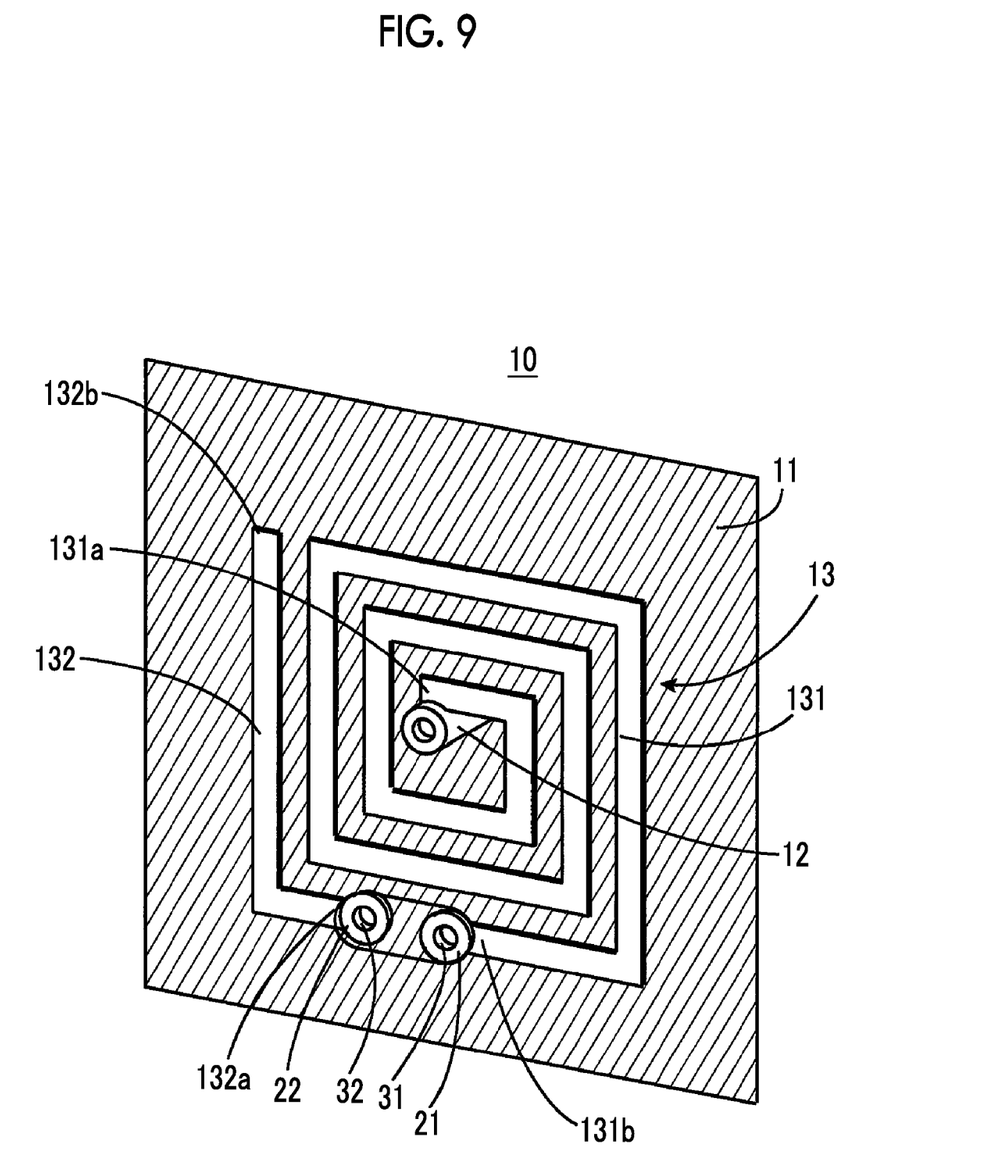
FIG. 9 is a view of a circuit for one unit of an EBG structure constituting an electronic circuit as a fifth exemplary embodiment of the present invention.

FIG. 9 is a view of a circuit for one unit of an EBG structure constituting an electronic circuit as a fifth exemplary embodiment of the present invention. In the present exemplary embodiment, a plurality of the units shown in FIG. 9 are arranged on the circuit board to form the EBG structure.

Differences from the example shown in FIG. 5 will be described.

In the example shown in FIG. 5 (and FIGS. 6 to 8), the conductor line constituting the stub 13 is present in the surface layer of the circuit board 10. However, in FIG. 9, the conductor line is formed inside the circuit board 10, for example, in a second conductor layer, not on the surface layer thereof. Therefore, vias 31 and 32 are respectively formed at the end portion 131b of the first conductor line 131 on the side separated from the via 12 and at the end portion 132a of the second conductor line 132 near the end portion 131b of the first conductor line 131. The via 31 is connected to the end portion 131b of the first conductor line 131 and the pad 21 formed on the surface layer. The via 32 is connected to the end portion 132a of the second conductor line 132 and is connected to the pad 22 formed on the surface layer. However, the vias 31 and 32 are not connected to the ground 11.

As shown in this example, the conductor line is not necessarily formed in the surface layer. Conductor lines connected by a via and extended over a plurality of layers may be employed. However, for example, the conductor lines are advisable to be connected to the surface layer for connection with each other.

The EBG structure having the spiral-shaped conductor line has been described, but the EBG structure in the exemplary embodiment of the present invention does not necessarily have the spiral-shaped conductor line.

Figure 10A:
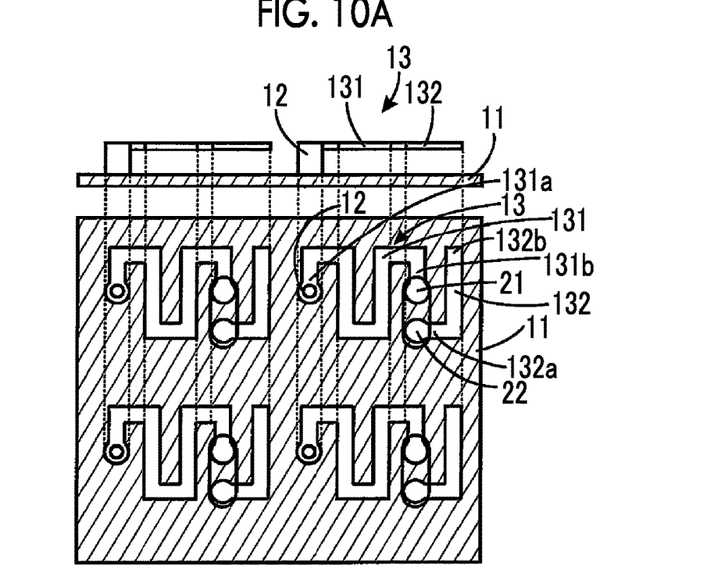
FIGS. 10A to 10C are views of exemplary embodiments in which conductor lines have shapes other than a spiral shape.
Figure 10B:
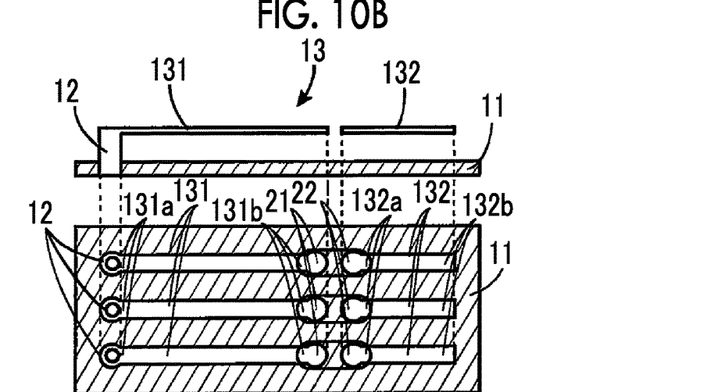
Figure 10C:
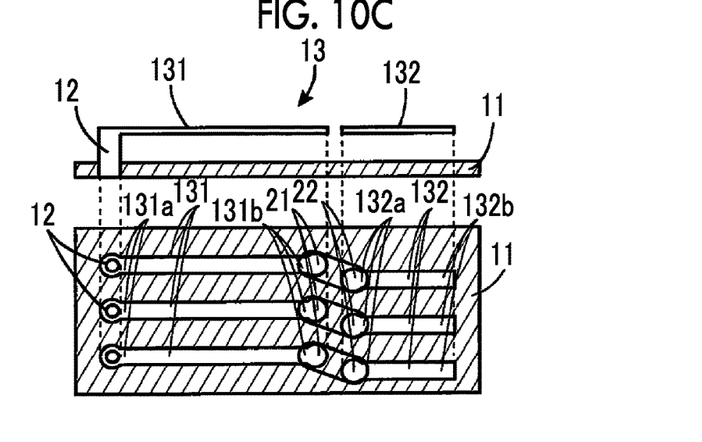

FIGS. 10A to 10C are views of exemplary embodiments in which conductor lines have shapes other than the spiral shape.

FIG. 10A shows an example of an EBG structure having a meander-shaped conductor line.

The stub 13 is composed of the first conductor line 131 and the second conductor line 132.

One end portion 131a of the first conductor line 131 is connected to the via 12 and extends toward the other end in the meander shape. An end portion 131b of the first conductor line 131 on a side separated from the via 12 is an open end, that is, an open end that is not directly connected to another conductor. A pad 21 for connecting to the second conductor line is formed at the end portion 131b.

The second conductor line 132 has one end portion 132a at a position close to the end portion 131b of the first conductor line 131 on the side separated from the via 12 and extends in a shape inheriting the meander shape of the first conductor line 131. That is, a shape that combines the first conductor line 131 and the second conductor line 132 is also a meander shape in which the meander shape of the first conductor line 131 is extended. The second conductor line 132 has open ends at both end portions 132a and 132b. Further, a pad 22 for connecting to the first conductor line 131 is formed at the end portion 132a of the second conductor line 132 on a side close to the end portion 131b of the first conductor line 131.

A protective film (not shown) referred to as a resist is formed on the surface of the circuit board 10, but no protective film is formed around the pads 21 and 22.

FIG. 10B shows an example of an EBG structure having a linear-shaped conductor line.

The stub 13 is composed of the first conductor line 131 and the second conductor line 132.

One end portion 131a of the first conductor line 131 is connected to the via 12 and extends in the linear shape toward the other end. An end portion 131b of the first conductor line 131 on a side separated from the via 12 is an open end, that is, an open end that is not directly connected to another conductor. A pad 21 for connecting to the second conductor line is formed at the end portion 131b.

The second conductor line 132 has one end portion 132a at a position close to the end portion 131b of the first conductor line 131 on the side separated from the via 12 and extends in a shape inheriting the linear shape of the first conductor line 131. That is, a shape that combines the first conductor line 131 and the second conductor line 132 is also a linear shape in which the linear shape of the first conductor line 131 is extended. The second conductor line 132 has open ends at both end portions 132a and 132b. Further, a pad 22 for connecting to the first conductor line 131 is formed at the end portion 132a of the second conductor line 132 on a side close to the end portion 131b of the first conductor line 131.

A protective film (not shown) referred to as a resist is formed on the surface of the circuit board 10, but no protective film is formed around the pads 21 and 22.

FIG. 10C shows an EBG structure similar to the EBG structure in FIG. 10BB.

In FIG. 10C, the second conductor line 132 is formed at a position slightly deviated from the extension of the linear shape of the first conductor line 131.

As shown in the example, the second conductor line 132 does not necessarily extend in a shape inheriting the shape in which the first conductor line 131 extends, and can be freely designed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic circuit comprising:
a conductor column that is connected to a ground of a first layer which is any one of a plurality of conductor layers stacked in a separated state and extends in a stacking direction;
a first conductor line that is connected to the conductor column to extend in a band shape in a second layer different from the first layer of the plurality of conductor layers, and of which an end portion separated from the conductor column is an open end; and
a second conductor line that extends in a band shape in any layer of the plurality of conductor layers,
wherein each of the first conductor line and the second conductor line has one neighboring portion constituting at least a pair of neighboring portions, which are close to each other to be connectable,
a first end portion of the second conductor line, which is separated from the neighboring portion formed on the second conductor line, is an open end, and
the second conductor line is connected to the conductor column through the first conductor line in a case where the pair of neighboring portions are connected.

2. The electronic circuit according to claim 1,
wherein the neighboring portion is formed on a surface layer of the plurality of conductor layers or extends to the surface layer in the stacking direction.

3. The electronic circuit according to claim 2,
wherein the pair of neighboring portions are short-circuited with each other.

4. The electronic circuit according to claim 1,
wherein the first conductor line is a conductor line of which an end portion different from the open end is connected to the conductor column.

5. The electronic circuit according to claim 2,
wherein the first conductor line is a conductor line of which an end portion different from the open end is connected to the conductor column.

6. The electronic circuit according to claim 3,
wherein the first conductor line is a conductor line of which an end portion different from the open end is connected to the conductor column.

7. The electronic circuit according to claim 4,
wherein the neighboring portion of the first conductor line is formed at the open end of the first conductor line.

8. The electronic circuit according to claim 5,
wherein the neighboring portion of the first conductor line is formed at the open end of the first conductor line.

9. The electronic circuit according to claim 6,
wherein the neighboring portion of the first conductor line is formed at the open end of the first conductor line.

10. The electronic circuit according to claim 7,
wherein the neighboring portion of the second conductor line is formed at a second end portion different from the first end portion of the second conductor line.

11. The electronic circuit according to claim 8,
wherein the neighboring portion of the second conductor line is formed at a second end portion different from the first end portion of the second conductor line.

12. The electronic circuit according to claim 9,
wherein the neighboring portion of the second conductor line is formed at a second end portion different from the first end portion of the second conductor line.

13. The electronic circuit according to claim 10,
wherein the second conductor line extends in a shape inheriting a shape in which the first conductor line extends.

14. The electronic circuit according to claim 11,
wherein the second conductor line extends in a shape inheriting a shape in which the first conductor line extends.

15. The electronic circuit according to claim 12,
wherein the second conductor line extends in a shape inheriting a shape in which the first conductor line extends.

16. The electronic circuit according to claim 13,
wherein both the first conductor line and a conductor line formed by combining the first conductor line and the second conductor line in a case of being connected to the first conductor line are conductor lines extending from one end portion toward the other end portion while continuously or intermittently bending in the same rotation direction.

17. The electronic circuit according to claim 14,
wherein both the first conductor line and a conductor line formed by combining the first conductor line and the second conductor line in a case of being connected to the first conductor line are conductor lines extending from one end portion toward the other end portion while continuously or intermittently bending in the same rotation direction.

18. The electronic circuit according to claim 15,
wherein both the first conductor line and a conductor line formed by combining the first conductor line and the second conductor line in a case of being connected to the first conductor line are conductor lines extending from one end portion toward the other end portion while continuously or intermittently bending in the same rotation direction.

19. A circuit board comprising:
the electronic circuit according to claim 1.

20. The circuit board according to claim 19,
wherein a plurality of the electronic circuits is mounted.

* * * * *